United States Patent [19]

Close et al.

[11] 4,439,815

[45] Mar. 27, 1984

[54] PRINTED CIRCUIT ASSEMBLY FOR A CARD FILE PACKAGING SYSTEM

[75] Inventors: Anthony D. Close, Wilton; Walter A. Menn, Stamford, both of Conn.

[73] Assignee: International Telephone and Telegraph Corporation, New York, N.Y.

[21] Appl. No.: 344,426

[22] Filed: Feb. 1, 1982

[51] Int. Cl.³ .............................................. H05K 1/14
[52] U.S. Cl. .................................. 361/386; 361/398; 361/414
[58] Field of Search ............... 361/398, 399, 412, 413, 361/414, 415, 386; 339/17 LC, 17 LM

[56] References Cited

U.S. PATENT DOCUMENTS

| | | | |
|---|---|---|---|
| 3,165,672 | 1/1965 | Gellert | 361/387 |
| 3,202,869 | 8/1965 | Matson et al. | 361/414 X |
| 3,259,805 | 7/1966 | Opishak | 361/388 |
| 3,289,047 | 11/1966 | Pick | 361/415 X |
| 3,368,115 | 2/1968 | Hoffman | 361/415 |
| 3,852,690 | 12/1974 | Telfer | 339/17 B X |
| 3,875,478 | 4/1975 | Capstick | 361/386 X |
| 4,164,071 | 8/1979 | Kruzich | 174/68.5 X |

FOREIGN PATENT DOCUMENTS

| | | | |
|---|---|---|---|
| 203624 | 10/1956 | Australia | 361/415 |
| 2848033 | 5/1980 | Fed. Rep. of Germany | 361/415 |
| 1224964 | 6/1960 | France | 361/417 |
| 1106590 | 3/1968 | United Kingdom | 361/395 |
| 2048586 | 12/1980 | United Kingdom | 339/17 LC |

Primary Examiner—R. R. Kucia
Attorney, Agent, or Firm—John T. O'Halloran; Jeffery P. Morris; Alfred C. Hill

[57] ABSTRACT

A printed circuit assembly for a card file packaging system is disclosed that includes a flat flexible dielectric member having printed conductors disposed thereon patterned to form a printed circuit and a single piece rigid molded dielectric member to which the flexible member is secured for support with the molded member having molded therein at least holes to support leads of the electrical components and, hence, the components themselves of the printed circuit and to enable connection of the leads of the electrical components to the printed conductors on the flexible member, slides for tracks of the card file system and electrical connectors to connect the printed circuit assembly to the card file system.

23 Claims, 4 Drawing Figures

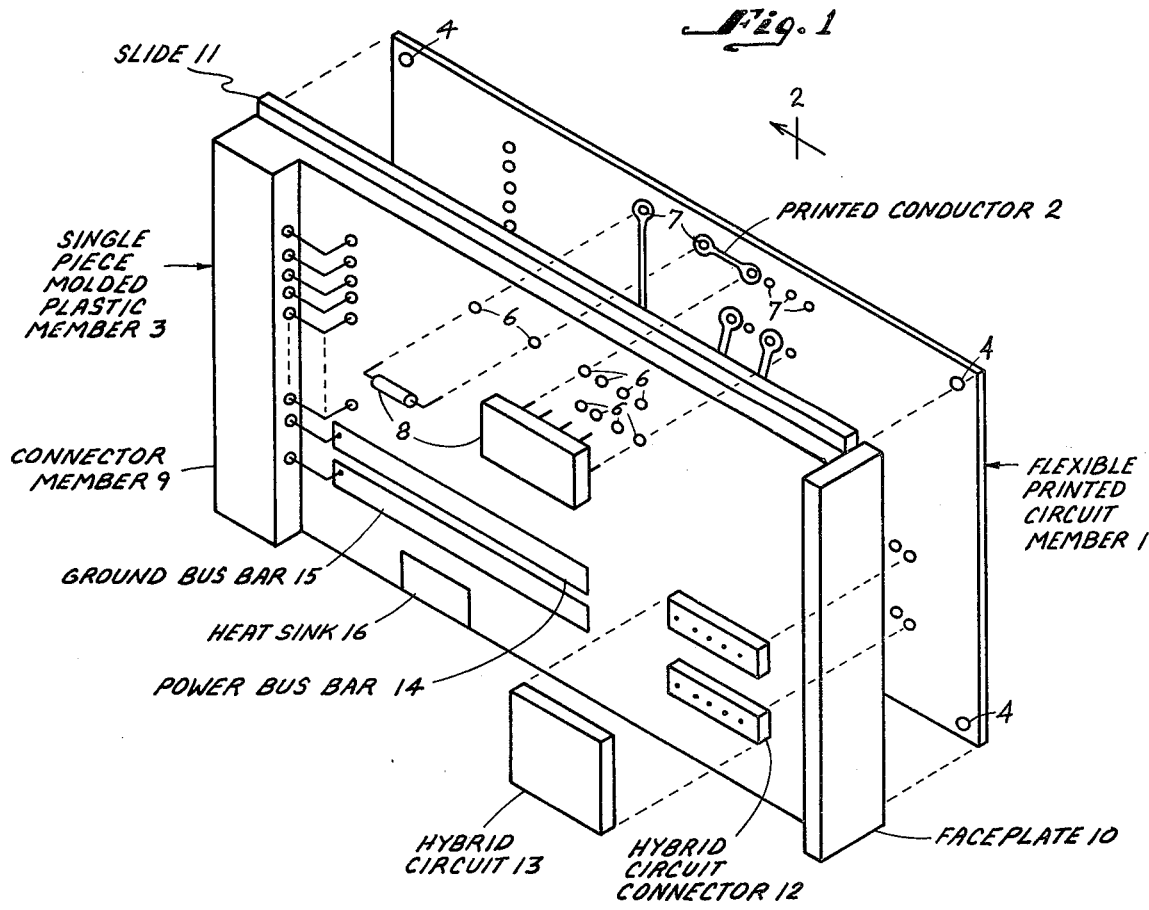
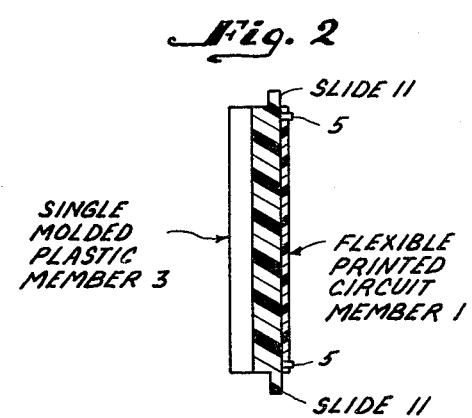
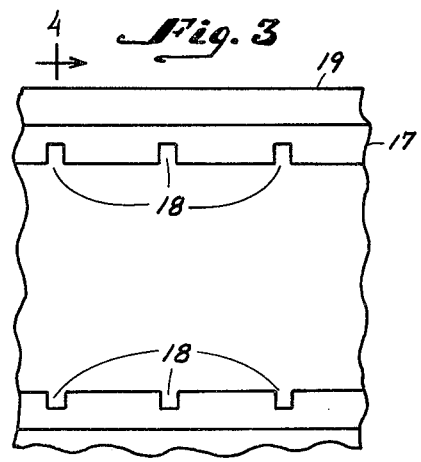
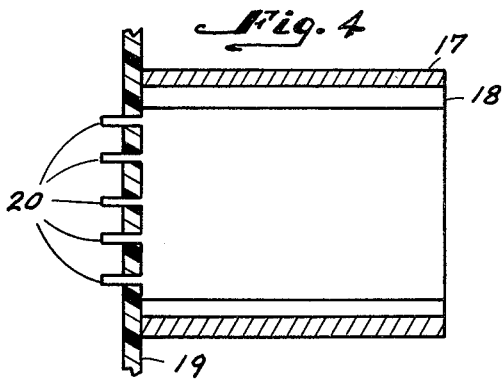

PRINTED CIRCUIT ASSEMBLY FOR A CARD FILE PACKAGING SYSTEM

BACKGROUND OF THE INVENTION

The present invention relates to printed circuits, and more particularly, to a printed circuit assembly for insertion in a card file packaging system.

The phrase "card file packaging system" means packaging of circuit components on a plurality of different printed circuit boards and arranging these boards as plug-in units either horizontally or vertically in relation to a vertical back plane member which includes thereon means for providing connection between the plurality of boards in the card file and also to circuitry outside of the card file itself.

In the past, the printed circuit boards and the components associated therewith have been provided on a printed board which must be provided with a separate connector assembly for connection with the vertical back plane, and a separate front face which may contain thereon identification of the card, components such as light emitting diode indicators and test jacks, as well as a handle to facilitate insertion and extraction of the card in the card file. In addition, where heat sinks are required, a separate heat sink must be provided in association with the printed board and additionally where power and ground bus bars are desired these components must additionally be provided as separate components. All of these separate components must be assembled to provide a printed circuit board which can be inserted into a card file packaging system.

The assembly of the various components necessary to make up the printed circuit board for use in a card file packaging system of necessity increases the cost of the card file packaging system due to the assembly costs.

SUMMARY OF THE INVENTION

An object of the present invention is to provide a printed circuit assembly for a card file packaging system which reduces the assembly costs relative to the prior phenolic board and thereby reduces the cost of the card file packaging system.

A feature of the present invention is the provision of a printed circuit assembly for a card file packaging system comprising: a flat flexible dielectric member having thereon printed conductors of a printed circuit thus obtaining economic advantage of reel-to-reel processing; and a single piece rigid molded dielectric member to which the flexible member is secured for support, the molded member having molded therein at least holes to support leads of electrical components of the assembly and to enable connections of the leads to the printed conductors, slides for tracks of the card file system and electrical connectors to connect the assembly to the card file system.

BRIEF DESCRIPTION OF THE DRAWING

Above-mentioned and other features and objects of this invention will become more apparent by reference to the following description taken in conjunction with the accompanying drawing, in which:

FIG. 1 is an isometric exploded view of a printed circuit assembly for a card file packaging system in accordance with the principles of the present invention;

FIG. 2 is a cross-sectional view taken along line 2—2 of FIG. 1;

FIG. 3 is a schematic front view of a card file capable of receiving the printed circuit assembly of FIGS. 1 and 2; and FIG. 4 is a cross-sectional view taken along line 4—4 of FIG. 3.

DESCRIPTION OF THE PREFERRED EMBODIMENT

Referring to FIG. 1, a printed circuit assembly for a card file packaging system in accordance with the principles of the present invention is shown to include a flexible printed circuit member 1 of dielectric material, such as a plastic material having disposed thereon printed conductors 2 of a circuit provided by the printed circuit assembly. The flat flexible printed circuit dielectric or plastic member 1 can provide very low cost inter-connecting conductor patterns, while providing very good line width definition. However, being flexible, member 1 requires some form of mechanical backing to make it practical for use as a printed circuit card for a card file packaging system.

The backing member for member 1 is provided by a single piece molded dielectric member 3 to which member 1 is secured. Member 1 may be secured to member 3 by heat staking which is accomplished by providing holes 4 in member 1 and projections 5 molded into member 3. Holes 4 are slid onto projections 5 and then projections 5 are heated to hold flexible member 1 against molded member 3. Alternatively, holes 4 could be fashioned to receive snap-on fasteners secured to member 3 so as to hold member 1 in position against member 3. Further, member 1 could be secured to member 3 by means of an adhesive. Molded member 3 may be made from a suitable plastic.

Molded member 3 is molded as a single piece member having holes 6 molded therein in alignment with holes 7 on member 1 so as to receive and support electrical components 8. Holes 7 may be plated-through or non plated-through holes. In addition, member 3 may have molded as an integral unit therewith the connector member 9 enabling connection with the vertical back plane of the card file, a faceplate 10, a slide 11 on the top and bottom thereof to engage the track of a card file to permit insertion and extraction of the printed circuit assembly in the card file and possibly an internal connector 12 for a hybrid circuit 13. Additionally, metal inserts, such as a power bus bar 14, ground bus bar 15, and a heat sink 16, could be provided in the plastic molded member 3 as an integral part thereof.

The material for member 3 would be selected to withstand exposure to wave-soldering during manufacturing of printed circuit assembly and hand-soldering during a repair of the printed circuit assembly.

The advantage of employing a single piece molded plastic member 3 to provide a support for flexible printed circuit member 1 as well as a support for the electrical components of the printed circuit and various other components necessary for utilization in a card file packaging system is that the cost of the separate pieces or components as well as their cost of assembly is reduced by including all of the above features and components in the single molding operation. Secondly, holes for mounting the electrical components 8 can be beveled relatively easily so that insertion of the electrical components in the holes 6 by automatic machinery is made easier.

Referring to FIGS. 3 and 4 there is illustrated therein schematically a card file used in a card file packaging system which includes a member 17 having therein tracks 18 to receive slides 11 of the printed circuit assembly of FIGS. 1 and 2 and a vertical back plane member 19 which may have receptacles 20 therein to receive male and/or female type connecting elements of connector member 9 to enable a interconnection between a plurality of printed circuit assemblies similar to that shown in FIGS. 1 and 2 and also to enable connection between the printed circuit assemblies in the card file packaging system to external circuitry remote from or otherwise associated with the card file packaging system.

While we have described above the principles of our invention in connection with specific apparatus it is to be clearly understood that this description is made only by way of example and not as a limitation to the scope of our invention as set forth in the objects thereof and in the accompanying claims.

We claim:

1. A printed circuit assembly for a card file packaging system comprising:
    a flat flexible dielectric member having thereon printed conductors of a printed circuit; and
    a single piece rigid molded dielectric member having a first relatively large flat surface against which said flexible member bears and to which said flexible member is secured for support, said molded member having molded therein at least holes to support leads of electrical components of said assembly disposed adjacent a second relatively large flat surface parallel to and spaced from said first surface, said holes enabling said leads to extend therethrough from said second surface to said first surface to enable connection of said leads to said printed conductors, said molded member having parallel slides molded therein along and extending from parallel edges thereof for tracks of said card file system and electrical connectors molded therein along a first edge thereof perpendicular to said parallel edges and adjacent said second surface, said electrical conductors extending outwardly from said first edge parallel to said second surface to connect said assembly to at least said card file system.

2. An assembly according to claim 1, wherein said flexible member is a flexible plastic member.

3. An assembly according to claim 2, wherein said molded member is a rigid plastic member.

4. An assembly according to claim 3, wherein said rigid plastic member is composed of a plastic material capable of withstanding exposure to wave-soldering during manufacture of said assembly and hand-soldering during repair of said assembly.

5. An assembly according to claim 1, wherein said molded member is a rigid plastic member.

6. An assembly according to claim 5, wherein said rigid plastic member is composed of a plastic material capable of withstanding exposure to wave-soldering during manufacture of said assembly and hand-soldering during repair of said assembly.

7. An assembly according to claims 1, 2, or 3, said molded member and said flexible member are secured to each other by heat staking.

8. An assembly according to claim 7, wherein said molded member further includes a hybrid circuit connector molded on said second surface and a faceplate molded on a second edge thereof parallel to said first edge as integral portions thereof.

9. An assembly according to claim 8, wherein said molded member further includes a plurality of metal inserts molded therein to provide selected one of a power bus bar, a ground bus bar and/or a heat sink.

10. An assembly according to claim 7, wherein said molded member further includes a plurality of metal inserts molded therein to provide selected one of a power bus bar, a ground bus bar and a heat sink.

11. An assembly according to claims 1, 2, or 3, wherein said molded member and said flexible member are secured to each other by snap-on means.

12. An assembly according to claim 11, wherein said molded member further includes a hybrid circuit connector and a faceplate as integral portions thereof.

13. An assembly according to claim 12, wherein said molded member further includes a plurality of metal inserts molded therein to provide selected ones of a power bus bar, a ground bus bar and a heat sink.

14. An assembly according to claim 11, wherein said molded member further includes a plurality of metal inserts molded therein to provide selected one of a power bus bar, a ground bus bar and a heat sink.

15. An assembly according to claims 1, 2, or 3, wherein said molded member and said flexible member are secured to each other by clip means.

16. An assembly according to claim 15, wherein said molded member further includes a hybrid circuit connector and a faceplate as integral portions thereof.

17. An assembly according to claim 16, wherein said molded member further includes a plurality of metal inserts molded therein to provide selected one of a power bus bar, a ground bus bar and a heat sink.

18. An assembly according to claim 15, wherein said molded member further includes a plurality of metal inserts molded therein to provide selected one of a power bus bar, a ground bus bar and a heat sink.

19. An assembly according to claims 1, 2, or 3, wherein said molded member and said flexible member are secured to each other by an adhesive.

20. An assembly according to claim 19, wherein said molded member further includes a hybrid circuit connector and a faceplate as integral portions thereof.

21. An assembly according to claim 20, wherein said molded member further includes a plurality of metal inserts molded therein to provide selected ones of a power bus bar, a ground bus bar and a heat sink.

22. An assembly according to claim 19, wherein said molded member further includes a plurality of metal inserts molded therein to provide at least a power bus bar, a ground bus bar and a heat sink.

23. An assembly according to claim 1, further including plated-through holes for electrically interconnecting conductors on the upper and lower surfaces of said flat flexible dielectric member.

* * * * *